United States Patent
Rothwell et al.

(10) Patent No.: US 7,566,632 B1
(45) Date of Patent: Jul. 28, 2009

(54) LOCK AND KEY STRUCTURE FOR THREE-DIMENSIONAL CHIP CONNECTION AND PROCESS THEREOF

(75) Inventors: Mary B. Rothwell, Ridgefield, CT (US); Ghavam G. Shahidi, Yorktown Heights, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/026,843

(22) Filed: Feb. 6, 2008

(51) Int. Cl.
*H21L 21/50* (2006.01)

(52) U.S. Cl. .................. 438/455; 438/106; 438/107; 257/E23.001; 257/E23.003; 257/731

(58) Field of Classification Search .......... 438/106, 438/107, 118, 464, 455; 257/678, 731, 732, 257/733, E23.003, E21.538
See application file for complete search history.

(56) References Cited

U.S. PATENT DOCUMENTS

| | | | |
|---|---|---|---|
| 6,355,501 B1 | 3/2002 | Fung et al. | |
| 6,821,826 B1 | 11/2004 | Chan et al. | |
| 7,157,787 B2 * | 1/2007 | Kim et al. ................. | 257/621 |
| 7,354,798 B2 * | 4/2008 | Pogge et al. ............... | 438/109 |
| 2002/0195673 A1 * | 12/2002 | Chou et al. ................ | 257/414 |

OTHER PUBLICATIONS

Despont et al, "Water-Scale Microdevice Transfer/Interconnect: Its Application in an AFM-Based Data-Storage System.", Journal of Microelectromechanical systems vol. 13 (2004): p. 895-901.*
Joubert, et al., "Polysilicon Gate Etching in High-Density Plasmas: Comparison Between Oxide Hard Mask and Resist Mask.", Journal of Electrochemical Society vol. 144 (1997): p. 1854-1861.*
H. B. Pogge et al., Proc. AMC'2001—"Bridging the Chip/Package Process Divide", pp. 129-136, 2001.
Guarini, K.W., et al; "Electrical Integrity of State-of-the-Art 0.13 μm SOI CMOS Devices and Circuits Transferred for Three-Dimensional (3D) Integrated Circuit (IC) Fabrication", IEMD2002, p. 943-45.
R. Yu, Proc. VMIC2007, "3D Integration—Past, Present and Future", pp. 1-8, 2007.
Despont, et al., "Wafer-Scale Microdevice Transfer/Interconnect: From a New Integration Method to its Application in an AFM-Based Data-Storage System," Transducers 2003, Solid-State Sensors, Actuators and Microsystems, 12th International Conference on Solid State Sensors, Actuators and Microsystems, Boston, Jun. 8-12, 2003, vol. 2, pp. 1907-1910.

* cited by examiner

*Primary Examiner*—Matthew Smith
*Assistant Examiner*—Michele Fan
(74) *Attorney, Agent, or Firm*—Gibb I.P. Law Firm, LLC; Ira D. Blecker, Esq.

(57) ABSTRACT

A method positions a first wafer with respect to a second wafer such that key studs on the first wafer are fit (positioned) within lock openings in the second wafer. The key studs contact conductors within the second wafer. The edges of the first wafer are tacked to the edges of the second wafer. Then the wafers are pressed together and heat is applied to bond the wafers together. One feature of embodiments herein is that because the lock openings extend through an outer oxide (instead of a polyimide) the first wafer can be attached to the second wafer by using processing that occurs in the middle-of-the-line (MOL).

20 Claims, 2 Drawing Sheets

LOCK AND KEY STRUCTURE FOR THREE-DIMENSIONAL CHIP CONNECTION AND PROCESS THEREOF

BACKGROUND

1. Field of the Invention

The embodiments of the invention provide a lock and key structure for three-dimensional chip connection and the process thereof where key studs on the first wafer contact conductors within the second wafer, and because the lock openings extend through an outer oxide, the first wafer can be attached to the second wafer by using processing that occurs in the middle-of-the-line (MOL) and at the back-end-of-the-line (BEOL).

2. Description of the Related Art

Three-dimensional (3D) chip integration presents many potential benefits for integrated circuit industries. For example, in 3D integrated circuits, each transistor may access a greater number of its nearest neighbors than a conventional two-dimensional (2D) circuit. This potentially allows each transistor or functional block to have a higher bandwidth and thus, in the aggregate, the device may operate properly at higher clock cycle rates. For 3D device integration (lamination of multiple wafers) there are several aspects that should be taken into consideration. The first concerns issues with interface bonding between the wafers, and the second concerns distortion and topography management.

Several different ways of integrating 3D chips are known, such as Cu—Cu compression, oxide-oxide (or polymer) bonding, etc. While each of the conventional methods has advantages for making 3D chips, conventional processes are monolithic, because the bonding is initiated either for metal or dielectric but not both. Since the interface needs both metal (via) and dielectric bonding, the monolithic methods inherently require a two step process to stitch the metal contacts or enforce the dielectric bonding. In this regard the monolithic approaches can be unreliable and complex. In addition, it is difficult to achieve sub-micron accuracy at the wafer level with monolithic bonding due to lack of constraints in either in-plane registration and/or topographical conformity.

SUMMARY

Embodiments herein provide a method for joining semiconductor wafers and a resulting structure. The method bonds the top of a first wafer to a temporary holder. The method can reduce the thickness of the wafer by first grinding or polishing.

The method herein can be used with structures that have pre-existing thru vias or can create new thru vias. Thus, the method can create new thru vias or expose pre-existing conductive thru vias on the bottom of the first wafer. Regardless of whether the thru vias are pre-existing, the method patterns a first mask (nitride-cap on an oxide-ILD (inter-level dielectric)) on the bottom of the first wafer and forms conductive key studs in locations on the first wafer as controlled by the first mask. The key studs can comprise new thru vias (if there were no pre-existing vias) or new contacts to pre-existing thru vias. The new contacts allow one to change the pitch and density of interface contacts from that of the thru-vias. The first mask is then removed to allow the key studs to extend from (project beyond) the bottom of wafer.

In separate processing that can occur before, simultaneously with, or after the processing of the first wafer, the methods herein form a second mask (nitride-cap, oxide-ILD, and adhesive) on a second wafer and form an adhesive on the second mask. Lock openings are then patterned through the second mask and the adhesive, and into the second wafer. These lock openings expose conductors within the interior of the second wafer (such conductors can comprise wiring, contacts, or thru vias).

After the first and second wafers are processed as described above, the method positions the first wafer with respect to the second wafer such that the key studs are fit (positioned) within the lock openings and the key studs contact the conductors within the second wafer. Next, the edges of the first wafer are tacked to the edges of the second wafer. Then the wafers are pressed together and heat is applied to bond the wafers together. After the first wafer is bonded to the second wafer, the temporary holder can be removed from the top of the first wafer and the top of the first wafer can be cleaned to expose conductive contacts on the top of the first wafer.

In other embodiments, the wafers can be arranged in a "face-to-face" manner where the active circuitry sides of the wafers are joined together. In different embodiments a laminated structure can be formed.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
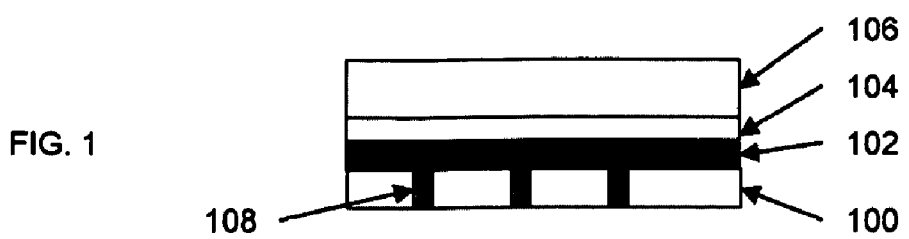
FIG. 1 is a schematic cross-sectional diagram of a partially completed integrated structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, monolithic approaches of integrating wafers are sometimes unreliable and complex. In addition, it is difficult to achieve sub-micron accuracy at the wafer level with monolithic bonding due to lack of constraints in either in-plane registration and/or topographical conformity. These issues are addressed in this disclosure which provides a hybrid interface structure and method. The method forms a stud/via or lock/key interface structure and bonds metals and dielectrics in one step. These methods help control the wafer level distortion within sub-micron range and such methods are insensitive to interface topography.

One feature of embodiments herein is that because oxide or nitride hardmasks are utilized, instead of materials such as polyimides, the first wafer can be attached to the second wafer by using processing that occurs in the middle-of-the-line (MOL), and during back-end-of-the-line (BEOL) processing. State of the art complementary metal oxide semiconductor (CMOS) devices have relatively low MOL (BEOL) temperature budget, which is gradually approaching the back-end-of-the-line (BEOL) temperatures of about 400° C. The MOL (BEOL) temperature budget issue is of issue for devices that are based on high-temperature-unstable substances, such as NiSi, since defect levels in these devices increase dramatically with a temperature greater than 450° C. For purposes herein, MOL process are considered to be those that can include applying iso-static pressures of less than approximately 150 psi and temperatures of less than approximately 425° C. Therefore, embodiments herein apply iso-static pressures of less than approximately 150 psi and temperatures of less than approximately 425° C. between the first wafer and the second wafer to cause the adhesive to bond the first wafer to the second wafer.

As shown in the drawings, embodiments herein include a method for joining semiconductor wafers and a resulting structure. More specifically, as shown in FIG. 1, the method bonds the top of a first wafer 100 to a temporary holder 106 using, for example a cured adhesive layer 102 (e.g., polyimide layer (e.g., 3-7 μm)) and a release layer 104 (e.g., polytetrafluoroethylene (PTFE), polyfluoroethylene (PFE), or any similar material (e.g., 12 μm)). The temporary holder 106 can comprise, for example, a layer of glass or any form of ceramic, Si wafers, or similar material, with a matching TCE (Thermal Coefficient of Expansion) with that of Si. The bonding process can apply an adhesion promoter to the layer of glass and/or wafer before applying the release layer 104 to the wafer 100 or the holder 106. After the adhesive 102 has been cured, the structure can be laminated using, for example a pressure of approximately 100 psi and a temperature of approximately 370° C.

The method can reduce the thickness of the wafer 100 by first grinding or polishing the first (or top) wafer 100. In one embodiment, the top wafer 100 is thinned in a multi-step process. For example, the top wafer 100 can first be mechanically thinned to 60-100 μm and further thinned to 10-20 μm (or less) by a common reactive ion etching (RIE) process. This two step thinning can achieve the desired top wafer thickness for thru-via formation.

The method herein can be used with structures that have pre-existing thru vias or the method can create new thru vias, or replace the pre-existing thru-vias with a new filling material. The via replacement allows the vias to be filled temporarily with a material with a high processing temperature (poly-Si during front-end-of-line processing (FEOL)) which is then replaced with a material having a high electrical conduction (Cu) in a later stage (e.g., BEOL). Pre-existing vias are illustrated in FIGS. 1-4 as item 108 and subsequently formed thru vias are illustrated in FIGS. 5-8 as item 600. Thus, FIGS. 5-8, that are discussed in detail below, illustrate a first wafer that does not initially include thru vias, but which has thru vias added by method embodiments herein.

Thus, the method can create new thru vias 600 or expose pre-existing conductive thru vias 108 on the bottom of the first wafer 100. Thru vias comprise conductors that extend from the top of the first wafer 100 completely through the wafer to the bottom of the wafer. The above thinning processes will generally expose any existing thru vias 108 as shown in FIG. 1.

Figure 2:
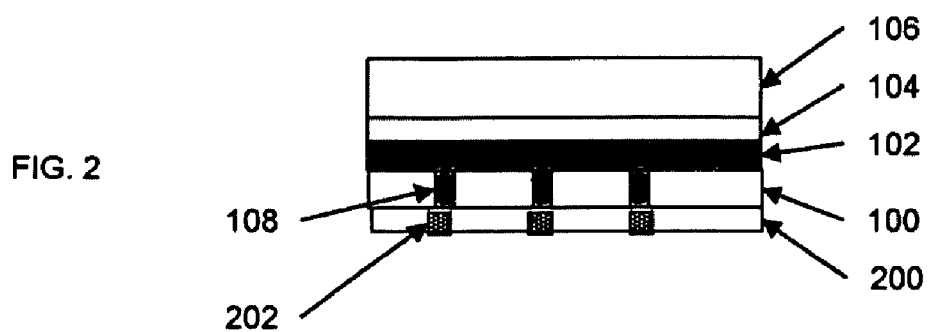
FIG. 2 is a schematic cross-sectional diagram of a partially completed integrated structure.
Figure 7:
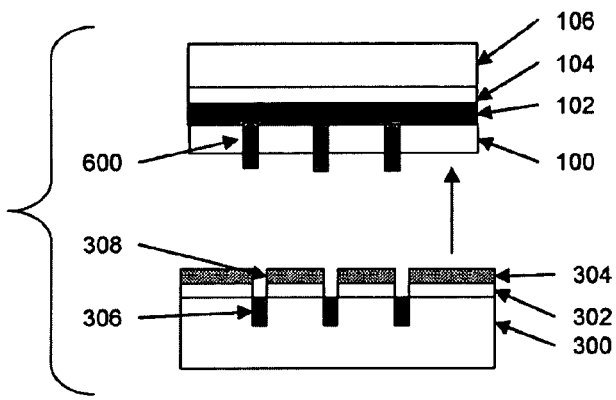
FIG. 7 is a schematic cross-sectional diagram of a partially completed integrated structure.
Figure 8:
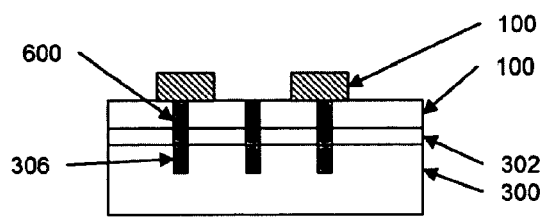
FIG. 8 is a schematic cross-sectional diagram of a partially completed integrated structure.

Regardless of whether the vias are pre-existing, the method patterns a first mask 200 on the bottom of the first wafer 100 and forms conductive key studs 202 in locations on the first wafer 100 as controlled by the first mask 200. The key studs can comprise new thru vias 600 (if there were no pre-existing vias) as shown in FIGS. 6-8, or new contacts 202 to pre-existing thru vias 108, as shown in FIG. 2. In the cases of new contacts, their pitch and size can be different from that of the thru-vias, allowing both thru-via and blind via connections between the two wafers.

More specifically, one exemplary process for forming the key studs begins by adding a nitride or oxide layer 200 (2-3 μm), or a thin nitride-cap with bulk oxide, to the bottom of the top wafer 100 as a hardmask. Then a lithographic process combined with reactive ion etching is used to create openings in the first mask 200 to define the future locations of the key studs 202 on the bottom of the top wafers. These openings are then filled/plated with a conductive material, such as a metal (e.g., Copper) and a polishing process (e.g., chemical-mechanical polishing (CMP)) can be used to remove any access conductive material. The metal fill can also involve depositing a layer of liner to increase the adhesion to the recess sidewall before the fill of the conductive metal.

Figure 3:
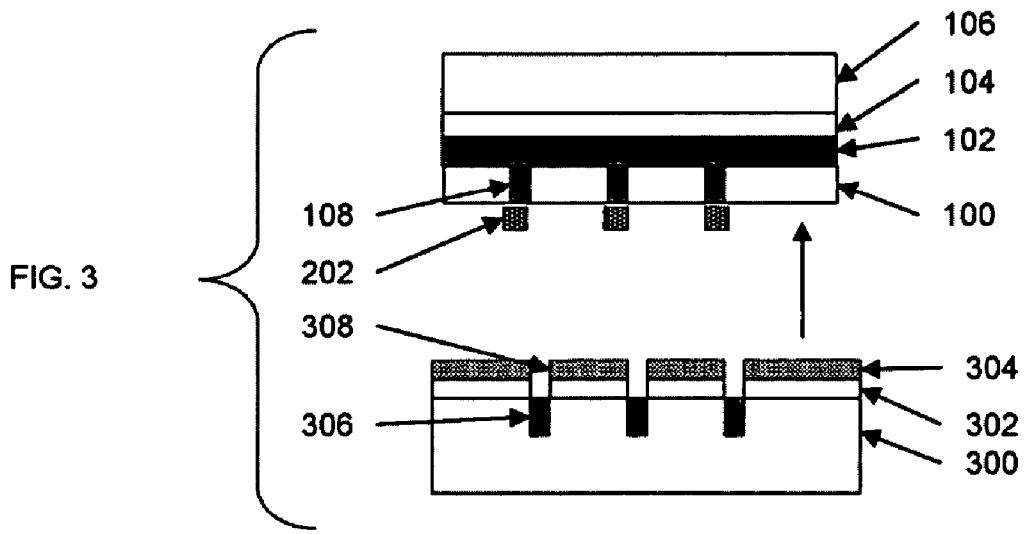
FIG. 3 is a schematic cross-sectional diagram of a partially completed integrated structure.
Figure 4:
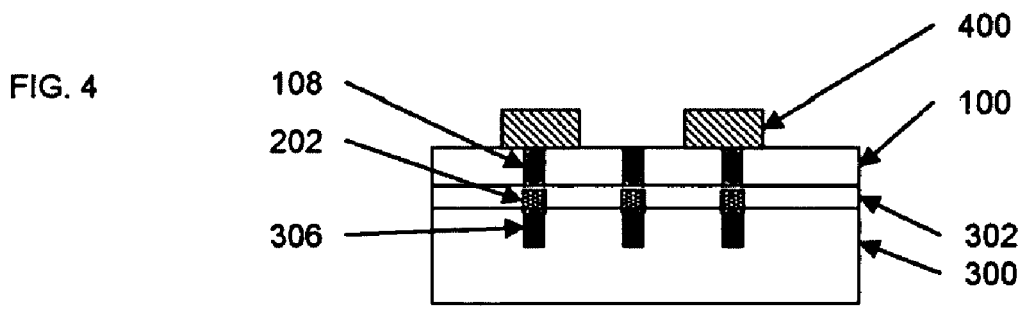
FIG. 4 is a schematic cross-sectional diagram of a partially completed integrated structure.

The first mask 200 is then removed to allow the key studs 202 to extend from (project beyond) the bottom of wafer, as shown in FIG. 3. For example, a reactive ion etching process can be used to remove the hardmask 200. When the cap material is used for the stud ILD, this RIE hardmask recess etch typically stops on the cap material to protect the conductive metal from corrosion. The etch chemistry is also chosen such that the liner deposited in the previous step is retained to protect the sidewall of the studs from corrosive environment as well. Subsequently, the key studs 202 can be cleaned in a wet process such as IPA/0.03% acetic/$H_2O$ rinse.

In separate processing that can occur before, simultaneously with, or after the processing of the first wafer 100, the methods herein form a second mask 302 on a second wafer 300 and form an adhesive 304 on the second mask layer 302. The second mask and adhesive can be a multi-layer structure. Therefore, in one example of processing the second mask 302, the method can cap the top of the bottom wafer 300 with a nitride or oxide base (e.g., 1 μm) and then coat an adhesive (e.g., 2 μm) on the 1 μm base surface. This can be followed by adding a 1000 Å oxide on the adhesive to serve as a reactive ion etching separate layer.

Lock openings 308 are then patterned through the second mask 302 and the adhesive 304, and into the second wafer 300. These lock openings 308 expose conductors 306 within the interior of the second wafer 300. Such conductors 306 can comprise internal wiring, contacts, or thru vias.

The process of forming the lock openings 308 can again be lithographic in nature and can define the via to have a critical dimension (CD) that is 1-10 µm larger than the key stud 202. Reactive ion etching can be used to create the openings 308 through the lithographic mask. If the multi-layer second mask is used, after the etching, there can be about 1.5 µm of the adhesive 304 remaining and this can be trimmed thinner as necessary. The method then cleans the lock openings 308 with any wet cleaner, again, such as IPA/0.03% acetic/$H_2O$.

After the first and second wafers are processed as described above, as shown by the arrow in FIG. 3, the method positions the first wafer 100 with respect to the second wafer such that the key studs 202 are fit (positioned) within the lock openings 308 and the key studs 202 contact the conductors 306 within the second wafer 300. Next, the edges of the first wafer 100 can be tacked to the edges of the second wafer using a low-temperature adhesive, such as a 5 min epoxy to hold the registration in place. This tack can also be accomplished by using localized laser heating or electrical spot welding, or simply mechanical clamping. Then, the wafers are pressed together and heat is applied to bond the wafers together and cause the conductive features (108, 202, 306, 600, etc.) to join with each other. For example, the aligned wafers can be placed in laminator with iso-static pressure. The adhesive 304 will bond when temperature reaches middle-of-the-line processing condition temperatures (e.g., 300° C.-425° C. and 100-150 psi. The ambient can be a vacuum and a gas purge can be used to avoid oxidation of any metal or adhesive.

After the first wafer 100 is bonded to the second wafer, the temporary holder 106 can be removed from the top of the first wafer 100 and the top of the first wafer 100 can be cleaned to expose conductive contacts on the top of the first wafer 100. More specifically, the glass carrier 106 can be released by laser application. The release layer 104 is removed with the glass carrier 106; however, the protective adhesive layer 102 remains to protect the top wafer 100. An oxygen RIE can be used to remove the protective layer 102. Then, a wet clean can be performed on the top of the top wafer 100. This process will expose the thru vias 108. As in FIG. 4 contacts 400 can be formed on the wafer 100 by, for example, applying solder paste thru a mold. Then, the wafer can be cleaned as necessary.

Figure 5:
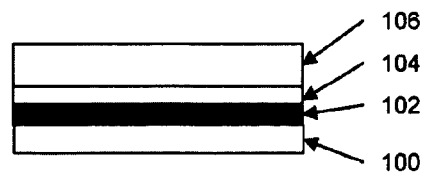
FIG. 5 is a schematic cross-sectional diagram of a partially completed integrated structure.

FIGS. 5-8 illustrate a substantially similar method; however, as mentioned above, the key studs can comprise new thru vias 600, because, as shown in FIG. 5, there were no pre-existing thru vias in the substrate 100.

Figure 6A:
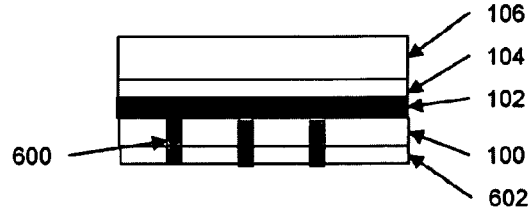
FIG. 6 is a schematic cross-sectional diagram of a partially completed integrated structure.

As shown in FIG. 6A, in one optional embodiment, an oxide or nitride hardmask 602 can be patterned (through positive resist lithographic and RIE processing) on the bottom of the wafer 100, and openings can be formed through the wafer 100 for the thru vias 600. The openings are first insulated from Si and then filled or plated with a conductor (e.g., Copper) to form the thru vias 600. After this the mask 602 is removed leaving the ends of the thru vias 600 extending from (projecting beyond) the bottom of the top wafer 100, as shown in FIG. 7. For example, a reactive ion etching process can be used to remove the hardmask 602. Subsequently, the key studs 600 can be cleaned in a wet process such as IPA/0.03% acetic/$H_2O$ rinse.

Figure 6B:
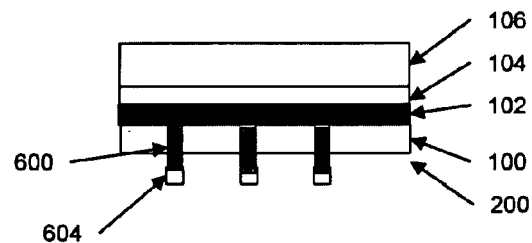

As shown in FIG. 6B, in a different optional embodiment, prior to forming the hardmask 604, openings can be formed through the wafer 100 for the thru vias 600. The openings can again be filled or plated with a conductor to form the thru vias 600. Then, an oxide or nitride hardmask 604 can be patterned (through negative resist lithographic and RIE processing) on the bottom of the wafer 100. The bottom of the wafer 100 is thinned further (using any of the previously mentioned processes). After this the mask 604 is removed leaving the ends of the thru vias 600 extending from (projecting beyond) the bottom of the top wafer 100, as shown in FIG. 7. For example, a reactive ion etching process can be used to remove the hardmask 604. Subsequently, the key studs 600 can be cleaned in a wet process such as IPA/0.03% acetic/$H_2O$ rinse. The processing shown in FIGS. 7 and 8 is the same as that described in FIGS. 3 and 4, except that the key studs 600 are the ends of the thru vias 600.

Figure 9:
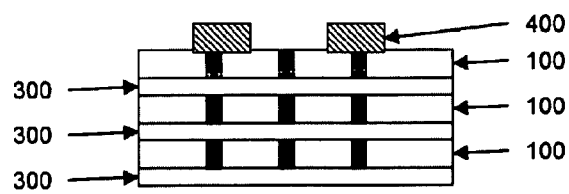
FIG. 9 is a schematic cross-sectional diagram of a partially completed integrated structure.

In different embodiments a laminated structure can be formed, as shown in FIG. 9. To form such a laminated structure of many wafer layers, the method repeats the bonding, the patterning of the first mask, the forming of the key studs, and the removing of the first oxide mask on a third wafer. Also, the forming of the second mask, the forming of the adhesive, and the patterning of the lock openings are repeated on the top of the first wafer. Then, the positioning, the applying of the heat and pressure can be repeated to bond the bottom of the third wafer to the top of the first wafer. The repeating processes can be continued for additional wafers to create a laminated structure.

In any of the foregoing embodiments, the wafers can be arranged in a "face-to-face" manner were the active circuitry sides of the wafers are joined together. In such a method, the top of the first wafer is positioned with respect to the top of the second wafer such that the key studs are positioned within the lock openings and the key studs contact the conductors within the second wafer. As above, heat and pressure is applied between the first wafer and the second wafer to cause the adhesive to bond the top of the first wafer to the top of the second wafer, after which the temporary holder can be removed from the bottom of the first wafer. For purposes herein, the "top" of the first wafer and the "top" of the second wafer comprises active circuitry. To the contrary, the "bottom" of the first wafer and the "bottom" of the second wafer comprise bulk silicon devoid of circuitry. Therefore, FIGS. 1-9 can illustrate face-to-face (top-to-top) joining of the wafers, or face-to-back (top-to-bottom) joining of the wafers.

One feature of embodiments herein is that because oxide or nitride hardmasks are utilized in the above processes, instead of materials such as polyimides, the first wafer can be attached to the second wafer by using processing that occurs in the middle-of-the-line (MOL) and in the back-end-of-the-line (BEOL). Therefore, embodiments herein apply iso-static pressures of less than approximately 150 psi and temperatures of less than approximately 425° C. between the first wafer and the second wafer to cause the adhesive to bond the first wafer to the second wafer and can safely be used in middle of the line processing. Further, the embodiments herein join and bond the insulators and conductors of the adjacent wafers in a single process, which is more efficient and increases yield.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method for joining semiconductor wafers, said method comprising:
   bonding a top of a first wafer to a temporary holder;
   one of creating and exposing at least one conductive thru vias on a bottom of said first wafer, wherein said thru vias comprise conductors that extend from said top of said first wafer completely through said first wafer to said bottom of said first wafer;
   patterning a first mask comprising one of an oxide and a nitride on said bottom of said first wafer;
   forming conductive key studs in locations on said first wafer as controlled by said first mask, such said key studs one of comprise said thru vias and contact said thru vias;
   removing said first mask to expose said key studs;
   forming a second mask comprising one of an oxide and a nitride on a second wafer;
   forming an adhesive on said second mask;
   patterning lock openings through said second mask and said adhesive, and into said second wafer, wherein said lock openings expose conductors within said second wafer;
   positioning said first wafer with respect to said second wafer such that said key studs are positioned within said lock openings and said key studs contact said conductors within said second wafer;
   applying heat and pressure between said first wafer and said second wafer to cause said adhesive on said second mask to bond said first wafer to said second wafer; and
   removing said temporary holder from said top of said first wafer.

2. The method according to claim 1, wherein said temporary holder comprises a layer of glass and said bonding comprises:
   applying an adhesion promoter to said layer of glass;
   applying said adhesion promoter to said top wafer;
   applying a polyimide to said wafer;
   curing said polyimide;
   applying said adhesion promoter to said polyimide; and
   attaching said glass to said wafer with an adhesive film between said glass and said wafer.

3. The method according to claim 1, further comprising, after said bonding of said first wafer to said temporary holder, reducing a thickness of said first wafer.

4. The method according to claim 3, wherein said reducing of said thickness of said first wafer comprises:
   one of grinding and polishing said first wafer;
   cleaning said wafer; and
   performing a reactive ion etching process to further thin said first wafer.

5. The method according to claim 1, wherein said applying of said heat and pressure comprises applying iso-static pressures of less than 150 psi and temperatures of less than 425° C.

6. The method according to claim 1, further comprising after said positioning of said first wafer with respect to said second wafer, tacking edges of said first wafer to edges of said second wafer using one of low-temperature adhesive, localized laser melting, localized electrical heating, and mechanical clamping.

7. The method according to claim 1, further comprising, after said removing of said temporary holder, cleaning said top of said first wafer to expose conductive contacts on said top of said first wafer.

8. A method for joining semiconductor wafers, said method comprising:
   creating and exposing conductive thru vias on a top of a first wafer, wherein said thru vias comprise conductors that extend from said top of said first wafer completely through said first wafer to said bottom of said first wafer;
   patterning a first mask comprising one of an oxide and a nitride on said top of said first wafer;
   forming conductive key studs in locations on said first wafer as controlled by said first mask, such said key studs one of comprise said thru vias and contact said thru vias;
   removing said first mask to expose said key studs;
   forming a second mask comprising one of an oxide and a nitride on a top of second wafer;
   forming an adhesive on said second mask;
   patterning lock openings through said second mask and said adhesive, and into said second wafer, wherein said lock openings expose conductors within said second wafer;
   positioning said top of said first wafer with respect to said top of said second wafer such that said key studs are positioned within said lock openings and said key studs contact said conductors within said second wafer;
   applying heat and pressure between said first wafer and said second wafer to cause said adhesive on said second mask to bond said top of said first wafer to said top of said second wafer; and
   reducing the thickness of said first wafer to the level of said thru vias to expose said thru vias on said bottom side of said first wafer;
   wherein said top of said first wafer and said top of said second wafer comprises active circuitry and wherein said bottom of said first wafer and a bottom of said second wafer comprise bulk silicon devoid of circuitry.

9. The method according to claim 8, wherein wiring under said key studs and sidewalls of said key studs are covered and sealed by said second mask.

10. The method according to claim 8, further comprising, after said bonding of said first wafer to said temporary holder, reducing a thickness of said first wafer.

11. The method according to claim 8, wherein said reducing of said thickness of said first wafer comprises:
    one of grinding and polishing said first wafer; and
    performing a reactive ion etching process to further thin said first wafer.

12. The method according to claim 8, wherein said applying of said heat and pressure comprises applying iso-static pressures of less than 150 psi and temperatures of less than 425° C.

13. The method according to claim 8, further comprising after said positioning of said first wafer with respect to said second wafer, tacking edges of said first wafer to edges of said second wafer using one of a low-temperature adhesive, local laser heating, local electrical spot welding, and mechanical clamping.

14. The method according to claim 8, further comprising, after said reducing of said thickness of said first wafer, cleaning said first wafer to expose conductive contacts on said first wafer.

15. A method for joining semiconductor wafers, said method comprising:
    bonding a top of a first wafer to a temporary holder;
    one of creating and exposing at least one conductive thru vias on a bottom of said first wafer, wherein said thru vias comprise conductors that extend from said top of said first wafer completely through said first wafer to said bottom of said first wafer;

patterning a first mask comprising one of an oxide and a nitride on said bottom of said first wafer;

forming conductive key studs in locations on said first wafer as controlled by said first mask, such said key studs one of comprise said thru vias and contact said thru vias;

removing said first mask;

forming a second mask comprising one of an oxide and a nitride on a second wafer;

forming an adhesive on said second mask;

patterning lock openings through said second mask and said adhesive, and into said second wafer, wherein said lock openings expose conductors within said second wafer;

positioning said first wafer with respect to said second wafer such that said key studs are positioned within said lock openings and said key studs contact said conductors within said second wafer;

applying heat and pressure between said first wafer and said second wafer to cause said adhesive on said second mask to bond said first wafer to said second wafer;

removing said temporary holder from said top of said first wafer;

repeating said bonding, said patterning of said first mask, said forming of said key studs, and said removing of said first mask on a third wafer;

repeating said forming of said second mask, said forming of said adhesive, and said patterning of said lock openings on said top of said first wafer;

repeating said positioning, said applying of said heat and pressure to bond a bottom of said third wafer to said top of said first wafer; and continuing said repeating processes for additional wafers to create a laminated structure.

16. The method according to claim 15, wherein said temporary holder comprises a layer of glass and said bonding comprises:

applying an adhesion promoter to said layer of glass;
applying a polyimide to said wafer;
curing said polyimide; and
attaching said glass to said wafer.

17. The method according to claim 15, further comprising, after said bonding of said first wafer to said temporary holder, reducing a thickness of said first wafer.

18. The method according to claim 17, wherein said reducing of said thickness of said first wafer comprises:

one of grinding and polishing said first wafer; and
performing a reactive ion etching process to further thin said first wafer.

19. The method according to claim 15, wherein said applying of said heat and pressure comprises applying iso-static pressures of less than 150 psi and temperatures of less than 425° C.

20. A method for joining semiconductor wafers, said method comprising:

bonding a top of a first wafer to a temporary holder, wherein said temporary holder comprises a layer of glass and said bonding comprises applying an adhesion promoter to said layer of glass, applying a polyimide to one of said first wafer and said glass, curing said polyimide, and attaching said glass to said first wafer;

reducing a thickness of said first wafer, wherein said reducing of said thickness of said first wafer comprises one of grinding and polishing said first wafer to a thickness of approximately 50-100 µm, and performing a reactive ion etching process to further thin said first wafer to a thickness of approximately 10-20 µm;

one of creating and exposing at least one conductive thru vias on a bottom of said first wafer, wherein said thru vias comprise conductors that extend from said top of said first wafer completely through said wafer to said bottom of said wafer;

patterning a first mask comprising one of an oxide and a nitride on said bottom of said first wafer;

forming conductive key studs in locations on said first wafer as controlled by said first mask, such said key studs one of comprise said thru vias and contact said thru vias;

removing said first mask;

forming a second mask comprising one of an oxide and a nitride on a second wafer;

forming a first adhesive on said second mask;

patterning lock openings through said second mask and said first adhesive, and into said second wafer, wherein said lock openings expose conductors within said second wafer;

positioning said first wafer with respect to said second wafer such that said key studs are positioned within said lock openings and said key studs contact said conductors within said second wafer;

tacking edges of said first wafer to edges of said second wafer using a second low-temperature adhesive;

applying iso-static pressures of less than 150 psi and temperatures of less than 425° C. between said first wafer and said second wafer to cause said first adhesive on said second mask to bond said first wafer to said second wafer;

removing said temporary holder from said top of said first wafer; and cleaning said top of said first wafer to expose conductive contacts on said top of said first wafer.

* * * * *